(12) United States Patent
Gall et al.

(10) Patent No.: US 9,293,608 B2
(45) Date of Patent: Mar. 22, 2016

(54) METHOD FOR PRODUCING A PHOTOVOLTAIC CELL HAVING A HETEROJUNCTION

(71) Applicant: COMMISSARIAT À L'ENERGIE ATOMIQUE ET AUX ENERGIES ALTERNATIVES, Paris (FR)

(72) Inventors: Samuel Gall, Arradon (FR); Maria-Delfina Munoz, Saint Christophe sur Guiers (FR)

(73) Assignee: COMMISSARIAT À L'ENERGIE ATOMIQUE ET AUX ENERGIES ALTERNATIVES, Paris (FR)

( * ) Notice: Subject to any disclaimer, the term of this patent is extended or adjusted under 35 U.S.C. 154(b) by 0 days.

(21) Appl. No.: 14/394,410

(22) PCT Filed: Apr. 10, 2013

(86) PCT No.: PCT/FR2013/000097
§ 371 (c)(1),
(2) Date: Oct. 14, 2014

(87) PCT Pub. No.: WO2013/153293
PCT Pub. Date: Oct. 17, 2013

(65) Prior Publication Data
US 2015/0079721 A1    Mar. 19, 2015

(30) Foreign Application Priority Data

Apr. 11, 2012   (FR) ...................................... 12 01064

(51) Int. Cl.
*H01L 31/02*    (2006.01)
*H01L 31/0232*    (2014.01)
(Continued)

(52) U.S. Cl.
CPC .... *H01L 31/02008* (2013.01); *H01L 31/02327* (2013.01); *H01L 31/022425* (2013.01);
(Continued)

(58) Field of Classification Search
USPC ............................................................ 438/72
See application file for complete search history.

(56) References Cited

U.S. PATENT DOCUMENTS

| | | |
|---|---|---|
| 2004/0097062 A1 | 5/2004 | Preu et al. |
| 2009/0223562 A1 | 9/2009 | Niira et al. |

(Continued)

FOREIGN PATENT DOCUMENTS

| | | |
|---|---|---|
| DE | 10 2006 046 726 A1 | 4/2008 |
| KR | 10-2012-0063758 A | 6/2012 |
| WO | WO 2011/111029 A1 | 9/2011 |

OTHER PUBLICATIONS

Holman, Zachary et al., "Increasing Short-Circuit Current in Silicon Heterojunction Solar Cells," *Photovoltaic Specialists Conference (PVSC)*, Jun. 19, 2011, 37th IEEE, IEEE, pp. 1448-1452.

Li, T.A. et al., "Thermal Stability of Microwave PECVD Hydrogenated Amorphous Silicon as Surface Passivation for N-Type Heterojunction Solar Cells," *Proceedings of the 22nd European Photovoltaic Solar Energy Conference*, Sep., 2007, pp. 1326-1331.

*Primary Examiner* — Asok K Sarkar
(74) *Attorney, Agent, or Firm* — Oliff PLC

(57) ABSTRACT

A method for producing a heterojunction photovoltaic cell includes formation of at least one anti-reflection layer on which at least one metal track is formed. The method includes heat treatment to make the contact connection between the track and the anti-reflection layer. The heat treatment selectively applies a laser beam on the track to generate a heat input up to anti-reflection layer.

18 Claims, 3 Drawing Sheets

(51) Int. Cl.
*H01L 31/072* (2012.01)
*H01L 31/0224* (2006.01)
*H01L 31/0747* (2012.01)
*H01L 31/20* (2006.01)

(52) U.S. Cl.
CPC .......... *H01L31/072* (2013.01); *H01L 31/0747* (2013.01); *H01L 31/202* (2013.01); *H01L 31/208* (2013.01); *Y02E 10/50* (2013.01); *Y02P 70/521* (2015.11)

(56) References Cited

U.S. PATENT DOCUMENTS

2010/0267194 A1    10/2010  Alemán et al.
2012/0055547 A1*   3/2012   Schultz-Wittmann
                            et al. .............................. 136/256
2013/0112251 A1*   5/2013   Hang et al. .................... 136/252

\* cited by examiner

METHOD FOR PRODUCING A PHOTOVOLTAIC CELL HAVING A HETEROJUNCTION

BACKGROUND OF THE INVENTION

The invention relates to a method for producing a heterojunction photovoltaic cell.

STATE OF THE ART

A photovoltaic cell can be formed by a multilayer stack more often than not comprising semiconductor materials such as silicon and enabling the received photons to be converted directly into an electric signal.

Such a photovoltaic cell can for example be a photovoltaic cell with a homojunction or heterojunction, and preferably with a homojunction or heterojunction made from silicon.

Conventionally, a homojunction photovoltaic cell successively comprises:
- a substrate made from semiconductor material such as silicon, doped with a predefined p or n type,
- a layer of semiconductor material, such as silicon, and doped with an opposite type, n or p, from that of the substrate in order to form a p/n junction; this junction enables collection of the photocarriers generated by illumination of the photovoltaic cell,
- an anti-reflection layer, ensuring a good absorption of the photons, for example made from silicon nitride with an optic index of 2.1,
- and electric contacts enabling the generated current to be collected.

To make the electric contacts, metal lines generally made from silver are conventionally deposited by screen printing on the anti-reflection layer. These contacts are produced from silver paste usually used with the screen printing deposition technique (screen printing paste called "conventional"). Said silver paste comprises between 70% and 85% of silver powder as well as sintered glass and additives. The sintered glass is composed for example of silica beads.

The contact connection is then made at the interface between the layer of semiconductor material and the metal lines (also called emitting area) in a heat treatment step at temperatures of more than 800° C.: the silver then passes through the anti-reflection layer and comes into contact with the emitting area.

A heterojunction photovoltaic cell conventionally comprises:
- a first layer, or substrate, made from crystalline semiconductor material (for example from silicon) and doped with a predefined n or p type,
- a second layer made from semiconductor material, for example from amorphous silicon, and doped with an opposite doping type to that of the first layer to form a p/n junction,
- a passivation layer made from amorphous and non-doped (or intrinsic) semiconductor material (for example from silicon), located between the first layer and the second layer to passivate the surface of the first layer,
- an anti-reflection layer,
- and electric contacts.

However, the layers of amorphous semiconductor material, and more particularly the layers of amorphous silicon have a poor temperature resistance. These amorphous layers do in fact partially recrystallize at temperatures of more than 200° C. thereby losing their passivation properties. In the case of heterojunction cells, it is then not possible to make a contact connection (i.e. in this case to make a contact between the previously formed metal track or tracks and the anti-reflection layer) with the method used for producing homojunction cells, this method requiring the use of temperatures of more than 800° C.

One of the approaches used at the present time to make the contact connection in a heterojunction photovoltaic cell consists in making electric contacts from a different screen printing paste than that used in homojunction cells. In particular, the screen printing paste is, in the case of heterojunction cells, suitable for low heat treatment temperatures. Unlike the paste called conventional used in the case of homojunction cells, the paste for heterojunction cells does not contain any sintered glass. This screen printing paste for heterojunction cells is called "special". The step of fainting the contact connection on the anti-reflection layer can also be performed at a temperature of less than 200° C.

However, the electric contacts obtained by this method do not have the same electric qualities as those of the electric contacts obtained for homojunction cells from a screen printing paste called "conventional"; suitable for homojunction photovoltaic cells. For example, the electric resistivity of the contacts of the heterojunction cell is higher.

For heterojunction photovoltaic cells, the method for making the electric contacts therefore generally consists in finding a compromise between the quality of the electric contacts, and in particular their electric resistivity properties, and the quality of passivation of the amorphous layers, the quality of one often being achieved to the detriment of the other.

OBJECT OF THE INVENTION

The object of the invention is to remedy the shortcomings of the prior art and in particular to propose a method for producing a heterojunction photovoltaic cell enabling high-quality electric contacts to be made, while at the same time preserving the underlying amorphous semiconductor material layers.

This object tends to be achieved by the appended claims.

BRIEF DESCRIPTION OF THE DRAWINGS

Other advantages and features will become more clearly apparent from the following description of particular embodiments of the invention given for non-restrictive example purposes and represented in the appended drawings, in which.

DESCRIPTION OF A PREFERRED EMBODIMENT OF THE INVENTION

A particular heat treatment is proposed to obtain the contact connection between the anti-reflection layer of a heterojunction photovoltaic cell and the metal track or tracks formed on said anti-reflection layer. This particular heat treatment consists in selectively applying a laser beam at the level of the metal track or tracks to generate a localized and controlled heat input up to the anti-reflection layer.

The contact connection thus enables formation of the electric contacts on the anti-reflection layer, the electric contacts being formed from the previously formed metal track or tracks. The heat treatment is performed under conditions such that the heat input, created by the localized application of the laser beam at the level of the metal track or tracks, is sufficiently high to create a high-quality contact connection between the track and the anti-reflection layer but is also controlled in order to only be generated up to the anti-reflection layer. The underlying layers such as the layers of amorphous material are thus not subjected to this heat input: they are thermally protected from said heat input due to the selective and controlled application of the laser beam. Advantageously, the heat input is generated up to the interface between the anti-reflection layer and the layer covering it (the metal track or tracks for example).

Figure 1:
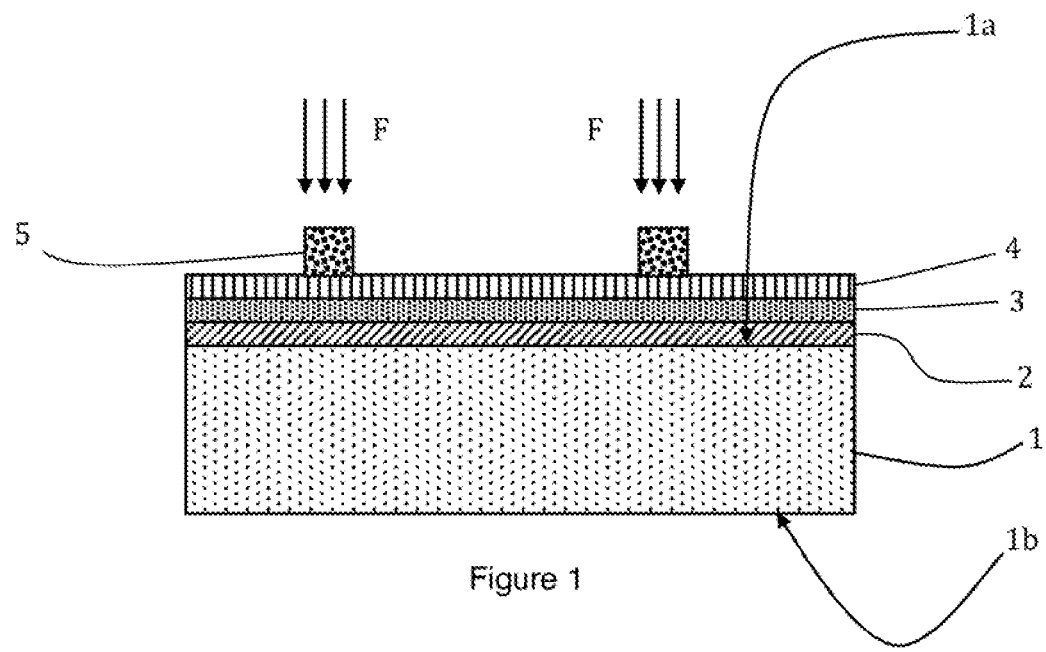
FIGS. 1 and 2 represent different steps of production of a heterojunction photovoltaic cell according to a first embodiment, in schematic manner in cross-section.
Figure 2:
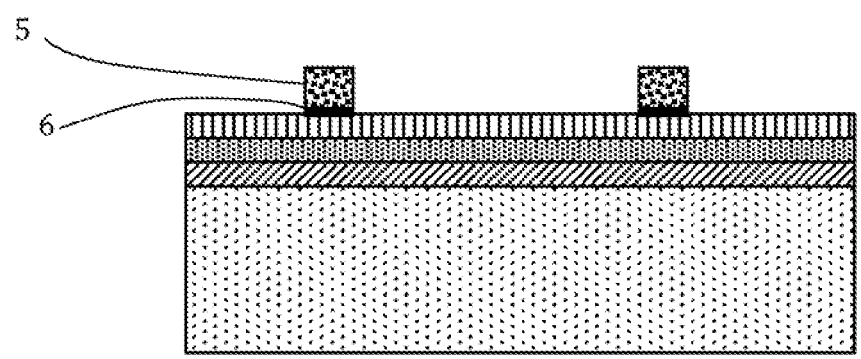

According to a particular embodiment illustrated in FIGS. 1 and 2, a heterojunction photovoltaic cell is formed by a substrate 1 made from crystalline semiconductor material and doped with a predefined type, n-type for example. Said substrate 1 comprises a front surface 1a on which there are successively formed:
- a layer of intrinsic amorphous semiconductor material 2,
- a layer of amorphous semiconductor material 3, doped with the opposite type to that of substrate 1, for example p-type, to form the heterojunction with substrate 1,
- an anti-reflection layer 4,
- and at least one metal track 5.

The layers of amorphous semiconductor material 2 and 3 can be deposited on substrate 1 by any type of method used in the field.

Advantageously, the heterojunction photovoltaic cell is made from a silicon base, i.e. substrate 1, intrinsic amorphous layer 2 and doped amorphous layer 3 are made from silicon. However, they could also be made from one or more other semiconductor materials such as germanium or a silicon-germanium alloy.

Preferably, anti-glare layer 4 is made from transparent conductive oxide (TCO). More particularly, anti-reflection layer 4 can be made from indium-tin oxide (ITO). It has a thickness that is advantageously comprised between 10 nm and 100 nm and preferably between 20 nm and 100 nm.

An anti-reflection layer 4 presents optic characteristics preventing a too large proportion of the luminous flux which reaches the surface of the cell from being reflected. Anti-reflection layer 4 also has particular physico-chemical characteristics enabling the surface of doped layer 3 to be passivated.

Anti-reflection layer 4 is advantageously deposited on layer 3 by plasma enhanced chemical vapor deposition. This technique enables a volume passivation to be combined with a surface passivation, while at the same time preserving required anti-reflection properties.

To avoid a too great reflection of the incident light, the surface of doped amorphous layer 3 and/or the surface of substrate 1, and therefore the surface of amorphous layer 2, can advantageously further present a texturing (not represented in the figures), for example in the shape of a pyramid.

Then, as illustrated in FIG. 1, one or more metal tracks 5 are advantageously formed on anti-reflection layer 4. In the figures, metal track 5 is for example in the form of a comb, i.e. in the form of parallel or substantially parallel lines (two lines are for example represented in FIG. 1). The lines are connected to one another at one of their ends by an additional line, perpendicular to the other lines. Metal track 5 can be composed of a single comb or of several interdigitated combs.

Metal track 5 can for example be formed by parallel lines having a width comprised between 20 μm and 100 μm, preferably between 70 μm and 100 μm, a thickness comprised between 10 μm and 60 μm and a space between lines comprised between 1 mm and 3 mm.

Metal track 5 can be deposited by physical vapor deposition, by ink jet or by spraying or any other suitable method to form a metallic pattern.

Metal track 5 can more particularly be formed by screen printing deposition of a metallic paste. The paste is deposited on a mask comprising openings. The pattern of the openings corresponds to the geometry of the metal track.

Preferably, the paste comprises a metal chosen for its electric conductivity properties and for its ability to make good ohmic contacts. It is advantageously silver-based, like that used to form the electric contacts of a homojunction photovoltaic cell, i.e. a silver-based paste able to thermally withstand temperatures of about 900° C. for 1 two 2 minutes. Said paste comprises for example between 70% and 85% of silver powder as well as sintered glass and additives. The sintered glass advantageously comprises silica beads. This paste presents the advantage of being less expensive than the special pastes normally used in a method for producing a heterojunction cell.

Metal track 5 can thus advantageously be formed by a silver base.

According to another particular embodiment, metal track 5 can be made from copper. The conductivity of copper (63*106 S·m−1) is substantially better than that of silver (59.6*106 S·m−1). The use of a metal track 5 made from copper thus advantageously enables production costs to be reduced. Furthermore, copper can be advantageously used in the scope of the invention as the contact connection of the copper with the anti-reflection layer is made by means of a localized heat treatment at high temperature under conditions such that the copper diffuses only up to anti-reflection layer 4. The copper will then not diffuse into the underlying layers, i.e. into amorphous layers 2 and 3 and/or into the underlying pin junction. There will therefore be no risk of short-circuiting.

In addition, the use of an anti-reflection layer 4, and more particularly an anti-reflection layer 4 made from ITO, enables this diffusion to be even further prevented by acting as "barrier" layer, i.e. this layer prevents the diffusion of copper, which has a great propensity to diffuse when heat treatment is performed at low temperature as in the prior art. It is for this reason that it is not common to use copper in photovoltaic cell metallization.

Anti-glare layer 4 is thus not only used to collect the charges photogenerated at the surface of the photovoltaic cell, but it can also act as a barrier to diffusion of copper when the latter is used to form the metal track or tracks. In the case of a metal track made from copper, the latter can also be formed by screen printing deposition from a copper paste. Said copper paste preferably contains between 70% and 85% of copper powder. It also comprises sintered glass, for example silica beads.

Once track 5 has been formed, a laser beam is selectively applied on track 5 (arrows F in FIG. 1). What is meant by selective application of a laser beam is that the laser beam is applied locally, in controlled manner and only on track 5. Thus, in FIG. 1, the latter is applied from a source (not shown) located above the heterojunction photovoltaic cell and is able to move so as to follow track 5. The heat input is thus localized on metal track 5, over its width and its thickness and its length by movement of the laser beam.

The laser beam preferably has a wavelength comprised between 248 nm and 1025 nm, and more particularly between 248 nm and 552 nm. The pulsation time is preferably comprised between 15 ps and 300 ns. Good results have been obtained for times comprised between 15 ps and 150 ns and between 15 ns and 300 ns. The pulsation frequency is preferably 80 MHz. The power, or fluence, of the laser is preferably comprised between 1 and 4 J/cm$^2$, and more particularly between 1 and 3 J/cm$^2$.

The temperature of the heat treatment, i.e. the temperature applied to the metal track during application of the laser beam, is advantageously greater than or equal to the temperature enabling melting of the silica beads, and is preferably comprised between 600° C. and 900° C.

The coupling between the energy of the laser and the metal of metal track 5 is important. This coupling in fact both enables the contact to be taken on anti-reflection layer 4 and the conduction properties of metal track 5 to be improved. The use of a heat treatment by laser beam advantageously enables a homogenous but controlled heat input to be generated in space and time. It further advantageously enables a heat input to be generated only up to metal track 5 and anti-reflection layer 4.

Figure 3:
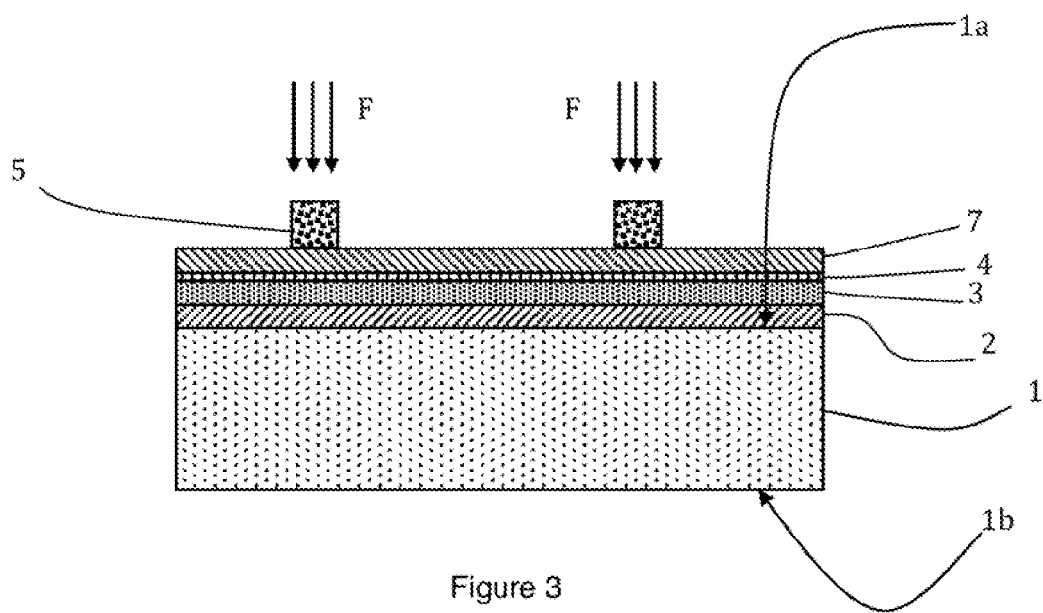
FIGS. 3 and 4 represent different steps of production of a heterojunction photovoltaic cell according to a second embodiment, in schematic manner in cross-section.
Figure 4:
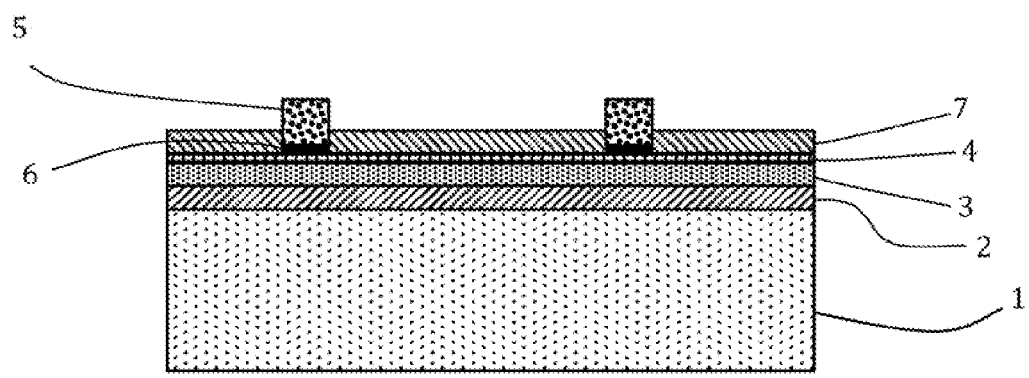

According to another embodiment, as represented in FIGS. 3 and 4, a layer of dielectric material 7, also called dielectric layer, can be interposed between anti-reflection layer 4 and metal track 5, before formation of said track. Metal track 5 is therefore in this case deposited directly on dielectric layer 7.

The contact connection, achieved by the irradiation step by laser beam (arrows F in FIG. 3), is then performed on metal track 5, itself deposited on dielectric layer 7. The radiation by laser beam enables heat to be locally input to metal track 5 and enables it to penetrate into dielectric layer 7 (due to the nature of the latter) and to come and make a contact on anti-reflection layer 4, as represented in FIG. 4.

Preferably, under irradiation laser, metal track 5 and dielectric layer 7 melt in order to make the contact connection. Dielectric layer 7 melts partially, in localized manner, at the level of the laser irradiation and up to the interface with anti-reflection layer 4. The sintered glass, present in the metallic paste, enhances the passage through dielectric layer 7.

Dielectric material layer 7 is preferably made from silicon oxide or silicon nitride, its thickness is comprised between 10 nm and 100 nm, and preferably between 20 nm and 100 nm.

Dielectric layer 7 is preferably deposited at low temperature, for example by Plasma Enhanced Chemical Vapor Deposition (PECVD) at a temperature of less than 300° C. The dielectric layer can also be deposited by spin-coating.

The use of a dielectric material layer 7 enables an anti-reflection layer 4 to be had with a smaller thickness than in the embodiment illustrated in FIGS. 1 and 2, i.e. without an intermediate dielectric layer 7. The current loss generated by a too great absorption of light, in particular ultraviolet light, in anti-reflection layer 4, is thus reduced.

Furthermore, the presence of dielectric layer 7 in the heterojunction photovoltaic cell enables good anti-reflecting properties to be preserved.

The stack formed by anti-reflection layer 4 with dielectric layer 7 thus induces a low light reflection.

In such a stack, the thickness of anti-reflection layer 4, preferably made from ITO, can be comprised between 10 nm and 50 nm with a square resistance comprised between 20 ohm/square and 80 ohm/square.

The thickness of dielectric layer 7 is adapted to that of anti-reflection layer 4 so that the minimum reflectivity of the assembly is situated between 600 nm and 630 nm. The quantity of photons transmitted, in the case of a photovoltaic cell made from silicon for example, is thus maximized.

In the case of a screen printing deposition to form metal track 5, the metallic paste comprises sintered glass which will start melting when laser irradiation is performed and foster penetration of the metallic paste into dielectric layer 7.

Rear surface 1b of substrate 1 is flat in FIGS. 1 to 4. This rear surface 1b can advantageously be covered by an electrode. It can however, in other cases, be textured and/or covered by a multilayer stack.

Figure 5:
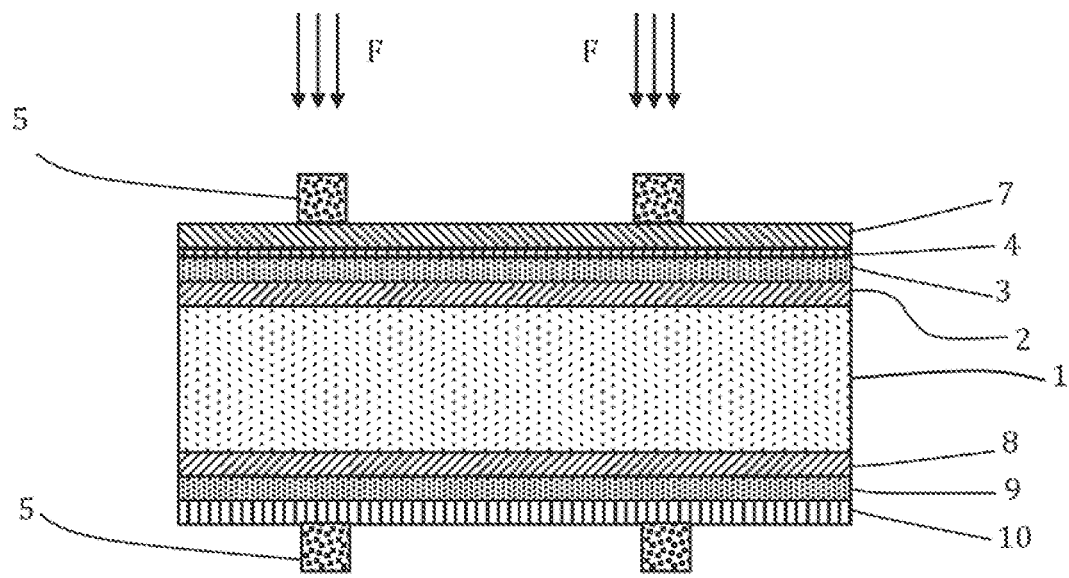
FIGS. 5 and 6 represent different steps of production of a heterojunction photovoltaic cell according to a third embodiment, in schematic manner in cross-section.
Figure 6:
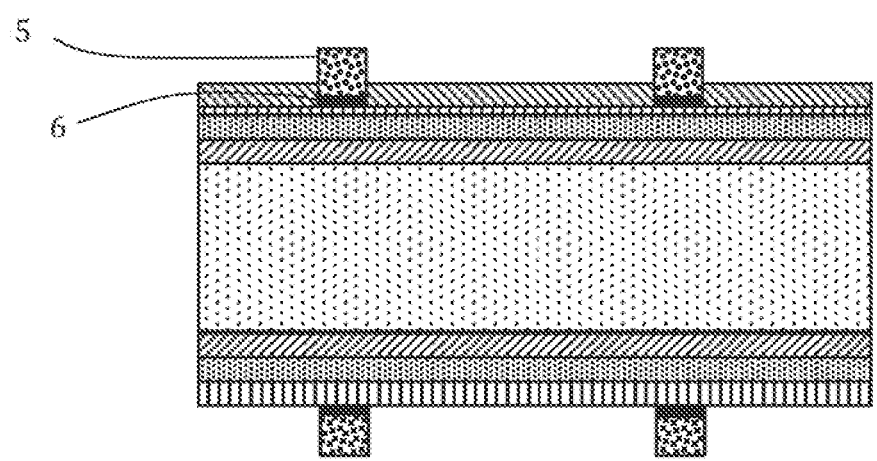

For example purposes, a heterojunction photovoltaic cell comprising an n-type substrate 1, as represented in FIGS. 5 and 6, is produced by executing the following steps:

- Chemical texturing of the surface of substrate 1, for example with a 1% KOH solution at 80° C. for 40 min,
- PECVD deposition of a layer of intrinsic amorphous silicon 2 (a-Si(i)) on the front surface of substrate 1, the thickness of the layer being comprised between 5 nm and 10 nm,
- PECVD deposition of a layer of doped amorphous silicon 3 (p a-Si(p)) on intrinsic amorphous layer 2, the thickness of the layer being comprised between 5 nm and 10 nm,
- deposition of an anti-glare layer 4 by spraying ITO on doped amorphous layer 3, the thickness of the anti-reflection layer being comprised between 20 nm and 100 nm,
- PECVD deposition of a dielectric layer 7 of SiNx on anti-reflection layer 4, the thickness of the dielectric layer being comprised between 20 nm and 100 nm,
- PECVD deposition on the rear surface of the substrate of a layer of intrinsic amorphous silicon 8 (a-Si(i)) with a thickness comprised between 2 nm and 8 nm,
- PECVD deposition on intrinsic amorphous layer 8 of a layer of n-doped amorphous silicon 9 (a-Si(n)), with a thickness comprised between 2 nm and 8 nm,
- MOCVD deposition (for metalorganic chemical vapour deposition) of an anti-reflection layer 10 on doped amorphous silicon layer 9 on the rear surface, anti-reflection layer 10 is either a layer of zinc oxide doped with boron ZnO(B) with a thickness comprised between 100 nm and 500 nm, or a layer of ITO with a thickness comprised between 80 nm and 100 nm,
- Deposition on the rear surface of a silver paste (or of a copper paste) by screen printing in order to form metal track 5 with a width of 70 μm-100 μm with a spacing of 2.1 mm between the lines,
- Deposition on the rear surface of a silver paste (or of a copper paste) by screen printing in order to form metal track 5 with a width of 30 μm-150 μm, and preferably with a width of 70 μm-100 μm, with a spacing of 2.1 mm between the lines.

All the steps of the method are performed at temperatures of less than 220° C. Finally, localized irradiation by laser beam (arrows F in FIG. 5) is performed on silver metal tracks 5 on the front and rear surface.

Advantageously, a layer of aluminium or silver can also be deposited by spraying, on the rear surface, on the metal track. The thickness of this layer is advantageously comprised between 200 nm and 500 nm.

The method for producing heterojunction photovoltaic cells according to the invention thereby enables a weak line resistance of the electric contacts to be obtained, and at the same time enables the passivation properties of the amorphous layer to be preserved. Furthermore, this method presents the advantage of being robust and easy to implement.

The invention claimed is:

1. A method for producing a heterojunction photovoltaic cell comprising at least one anti-reflection layer on which at least one metal track is formed, said method comprising heat treatment to establish an electric contact between the track and the anti-reflection layer by selectively applying a laser beam on said track so as to generate a heat input up to the anti-reflection layer,
   wherein the anti-reflection layer is made from a conducting transparent oxide, and
   wherein the laser beam has a wavelength between 248 nm and 1025 nm, a pulsation time between 15 ns and 300 ns and a fluence between 1 $J/cm^2$ and 4 $J/cm^2$.

2. The method according to claim 1, wherein the anti-reflection layer is made from indium-tin oxide.

3. The method according to claim 1, wherein the thickness of the anti-reflection layer is between 10 nm and 100 nm.

4. The method according to claim 1 wherein the metal track has a thickness between 10 μm and 60 μm.

5. The method according to claim 1, wherein, the metal track is in the form of a comb.

6. The method according to claim 1, wherein the metal track is made from silver.

7. The method according to claim 1, wherein the metal track is made from copper.

8. The method according to claim 1, wherein formation of the metal track is performed by screen printing deposition of a metallic paste, the heat treatment being applied onto said paste so as to establish said electric contact.

9. The method according to claim 8, wherein, the metallic paste comprises between 70% and 85% of metal powder and sintered glass.

10. The method according to claim 1, wherein, formation of the metal track is performed by one of physical vapor deposition, ink jet or spraying.

11. The method according to claim 1, wherein the laser irradiation is configured to heat the metal track between 600° C. and 900° C.

12. The method according to claim 1, wherein a layer of dielectric material is interposed between the anti-reflection layer and the metal track before formation of said track.

13. The method according to claim 12, wherein the layer of dielectric material is made from silicon oxide or from silicon nitride.

14. The method according to claim 12, wherein the layer of dielectric material has a thickness between 10 nm and 100 nm.

15. The method according to claim 12, wherein the thickness of the anti-reflection layer is between 10 nm and 50 nm, the thickness of the dielectric material being adapted to the thickness of the anti-reflection layer so as to have a minimum of reflectivity between 600 nm and 630 nm.

16. The method according to claim 1, wherein the thickness of the anti-reflection layer is between 20 nm and 100 nm.

17. The method according to claim 1, wherein the laser beam has a wavelength comprised between 248 nm and 552 nm, and a fluence of between 1 $J/cm^2$ and 3 $J/cm^2$.

18. The method according to claim 1, wherein the metal track does not extend across the anti-reflection layer.

\* \* \* \* \*